US008884156B2

(12) United States Patent
Schmaelzle et al.

(10) Patent No.: US 8,884,156 B2
(45) Date of Patent: *Nov. 11, 2014

(54) SOLAR ENERGY HARVESTING DEVICE USING STIMULI-RESPONSIVE MATERIAL

(75) Inventors: Philipp H. Schmaelzle, Los Altos, CA (US); Gregory L. Whiting, Mountain View, CA (US); Joerg Martini, San Francisco, CA (US); David K. Fork, Mountain View, CA (US); Patrick Y. Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 974 days.

This patent is subject to a terminal disclaimer.

(21) Appl. No.: 12/955,688

(22) Filed: Nov. 29, 2010

(65) Prior Publication Data

US 2012/0132255 A1    May 31, 2012

(51) Int. Cl.
*H01L 31/00* (2006.01)
*H01L 31/052* (2014.01)
*G02B 6/42* (2006.01)

(52) U.S. Cl.
CPC ............. *H01L 31/0524* (2013.01); *Y02E 10/52* (2013.01); *H01L 31/0525* (2013.01); *G02B 6/4298* (2013.01); *H01L 31/0522* (2013.01)
USPC .......................................... 136/246; 136/259

(58) Field of Classification Search
CPC ............ H01L 31/0524; H01L 31/0525; H01L 31/0522
USPC ............................................ 136/89, 246, 259
See application file for complete search history.

(56) References Cited

U.S. PATENT DOCUMENTS 3,923,381 A    12/1975 Winston
3,988,166 A    10/1976 Beam
(Continued)

FOREIGN PATENT DOCUMENTS

CN    2606309 Y    3/2004
CN    1854637 A    11/2006
(Continued)

OTHER PUBLICATIONS

Gyenes, et al "Electrically adjustable thermotropic windows based on polymer gels", polymers for advanced technologies, 14, 2003, 757-762.*

(Continued)

*Primary Examiner* — Jennifer Michener
*Assistant Examiner* — Marla D McConnell
(74) *Attorney, Agent, or Firm* — Bever, Hoffman & Harms, LLP; Patrick T. Bever

(57) ABSTRACT

A solar energy harvesting system including a sunlight concentrating member (e.g., a lens array) for focusing direct sunlight at predetermined focal points inside a waveguide containing a stimuli-responsive material (SRM) that is evenly distributed throughout the waveguide material such that the SRM assumes a relatively high transparency state away from the focused sunlight, and small light-scattering portions of the SRM change to a relatively opaque (light scattering) state only in focal zone regions adjacent to the concentrated sunlight. The outer waveguide surfaces are locally parallel (e.g., planar) and formed such that sunlight scattered by the light-scattering SRM portions is transmitted by total internal reflection through the remaining transparent waveguide material, and outcoupled to one or more solar energy receivers (e.g., PV cells) that are disposed outside the waveguide (e.g., along the peripheral edge).

22 Claims, 9 Drawing Sheets

(56) References Cited

U.S. PATENT DOCUMENTS

| | | | |
|---|---|---|---|
| 4,021,267 A | 5/1977 | Dettling |
| 4,045,246 A | 8/1977 | Mlavsky et al. |
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,114,596 A | 9/1978 | Chang et al. |
| 4,131,485 A | 12/1978 | Meinel et al. |
| 4,148,301 A | 4/1979 | Cluff |
| 4,177,083 A | 12/1979 | Kennedy |
| 4,221,468 A | 9/1980 | Macken |
| 4,224,081 A | 9/1980 | Kawamura et al. |
| 4,234,351 A | 11/1980 | Deminet et al. |
| 4,296,731 A | 10/1981 | Cluff |
| 4,320,251 A | 3/1982 | Narasimhan et al. |
| 4,331,703 A | 5/1982 | Lindmayer |
| 4,337,758 A | 7/1982 | Meinel et al. |
| 4,440,153 A | 4/1984 | Melchior |
| 4,683,348 A | 7/1987 | Pidgeon et al. |
| 4,711,972 A | 12/1987 | O'Neill |
| 4,746,370 A | 5/1988 | Woolf |
| 4,771,764 A | 9/1988 | Cluff |
| 4,792,685 A | 12/1988 | Yamakawa |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,947,825 A | 8/1990 | Moriarty |
| 4,952,026 A | 8/1990 | Bellman et al. |
| 5,004,319 A | 4/1991 | Smither |
| 5,062,899 A | 11/1991 | Kruer |
| 5,089,055 A | 2/1992 | Nakamura |
| 5,167,724 A | 12/1992 | Chiang |
| 5,172,170 A | 12/1992 | Hays et al. |
| 5,180,441 A | 1/1993 | Cornwall et al. |
| 5,216,543 A | 6/1993 | Calhoun |
| 5,344,496 A | 9/1994 | Stern et al. |
| 5,389,159 A | 2/1995 | Kataoka et al. |
| 5,404,869 A | 4/1995 | Parkyn, Jr. et al. |
| 5,501,743 A | 3/1996 | Cherney |
| 5,529,054 A | 6/1996 | Shoen |
| 5,540,216 A | 7/1996 | Rasmusson |
| 5,552,820 A | 9/1996 | Genovese |
| 5,559,677 A | 9/1996 | Errichiello |
| 6,011,307 A | 1/2000 | Jiang et al. |
| 6,020,554 A | 2/2000 | Kaminar et al. |
| 6,091,017 A | 7/2000 | Stern |
| 6,094,273 A | 7/2000 | Asher et al. |
| 6,097,530 A | 8/2000 | Asher et al. |
| 6,118,067 A | 9/2000 | Lashley et al. |
| 6,130,465 A | 10/2000 | Cole |
| 6,131,565 A | 10/2000 | Mills |
| 6,140,570 A | 10/2000 | Kariya |
| 6,165,389 A | 12/2000 | Asher et al. |
| 6,239,353 B1 | 5/2001 | Hall et al. |
| 6,274,508 B1 | 8/2001 | Jacobsen et al. |
| 6,278,054 B1 | 8/2001 | Ho et al. |
| 6,379,521 B1 | 4/2002 | Nishio |
| 6,407,329 B1 | 6/2002 | Iino et al. |
| 6,410,644 B2 | 6/2002 | Mumick et al. |
| 6,420,266 B1 | 7/2002 | Smith et al. |
| 6,451,429 B2 | 9/2002 | Mumick et al. |
| 6,479,395 B1 | 11/2002 | Smith et al. |
| 6,527,964 B1 | 3/2003 | Smith et al. |
| 6,531,653 B1 | 3/2003 | Glenn et al. |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,896,381 B2 | 5/2005 | Benitez et al. |
| 6,958,868 B1 | 10/2005 | Pender |
| 7,045,794 B1 | 5/2006 | Spallas et al. |
| 7,152,985 B2 | 12/2006 | Benitez et al. |
| 7,160,522 B2 | 1/2007 | Minano Dominguez et al. |
| 7,181,378 B2 | 2/2007 | Benitez et al. |
| 7,638,708 B2 | 12/2009 | Fork et al. |
| 2002/0056473 A1 | 5/2002 | Chandra et al. |
| 2002/0148497 A1 | 10/2002 | Sasaoka et al. |
| 2002/0149107 A1 | 10/2002 | Chang et al. |
| 2003/0016539 A1 | 1/2003 | Minano et al. |
| 2003/0051750 A1 | 3/2003 | Lawheed |
| 2003/0232174 A1 | 12/2003 | Chang et al. |
| 2004/0031517 A1 | 2/2004 | Bareis |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0211460 A1 | 10/2004 | Simburger et al. |
| 2005/0029236 A1 | 2/2005 | Gambino et al. |
| 2005/0034751 A1 | 2/2005 | Gross et al. |
| 2005/0046977 A1 | 3/2005 | Shifman |
| 2005/0081908 A1 | 4/2005 | Stewart |
| 2006/0207650 A1 | 9/2006 | Winston et al. |
| 2006/0231133 A1 | 10/2006 | Fork et al. |
| 2007/0137690 A1 | 6/2007 | Bruning et al. |
| 2007/0137691 A1 | 6/2007 | Cobb et al. |
| 2008/0047605 A1 | 2/2008 | Benitez et al. |
| 2008/0186593 A1 | 8/2008 | Chan et al. |
| 2008/0308154 A1 | 12/2008 | Cart et al. |
| 2009/0056789 A1 | 3/2009 | Draganov |
| 2009/0084374 A1 | 4/2009 | Mills et al. |
| 2011/0031211 A1 | 2/2011 | Chan et al. |
| 2011/0226332 A1* | 9/2011 | Ford et al. .................... 136/259 |

FOREIGN PATENT DOCUMENTS

| | | |
|---|---|---|
| CN | 101227158 A | 7/2008 |
| DE | 3104690 A1 | 8/1982 |
| DE | 3205439 A1 | 8/1983 |
| DE | 3633172 A1 | 4/1988 |
| DE | 19735281 A1 | 2/1999 |
| DE | 10125273 B4 | 7/2006 |
| EP | 0200496 A2 | 11/1986 |
| EP | 0575797 A1 | 12/1993 |
| EP | 1715260 A | 10/2006 |
| JP | 2-122159 A | 5/1990 |
| JP | 2005-327595 A | 11/2005 |
| JP | 2006-83036 A | 3/2006 |
| KR | 20010104037 A | 11/2001 |
| WO | 94/28361 A1 | 12/1994 |
| WO | 00/49421 A1 | 8/2000 |
| WO | 00/49658 A1 | 8/2000 |
| WO | 02/097724 A1 | 12/2002 |
| WO | 2007/104028 A1 | 9/2007 |
| WO | WO2007109901 A1 | 10/2007 |
| WO | WO2008005557 A2 | 1/2008 |

OTHER PUBLICATIONS

Knorov, et al, "Three-dimensional reversible laser micromachining with subnanjoule femtosceond pulses based on two-photon photochroism", Applied Physics B, 76, 2003, 707-710.*

Goetzberger, Adolf, et al. "Self-Regulatng Glare Protection System using Concentrated Solar Radiation and Thermotropic Coating", Solar Energy, vol. 69, Nos. 1-6, 2000, pp. 45-47.

Nitz, Peter and Helge Hartwig, "Solar control with thermotropic layers", Solar Energy 79 (2005), pp. 573-582.

Mulligan et al. "A Flat-Plate Concentrator: Micro-Concentrator Design Overview", 2000 IEEE, pp. 1495-1497.

Terao et al. "A Mirror-Less Design for Micro-Concentrator Modules", Conference Record of the 28th IEEE Photovoltaic Specialists Conference (2000) pp. 1416-1419.

Mulligan et al. "Development of Chip-Size Silicon Solar Cells", IEEE Photovoltaic Specialists Conference, 2000, pp. 158-163.

Bett et al. "Flatcon and Flashcon Concepts for High Concentration PV", Presented at the 19th European Photovoltaic Solar Energy Conf., Jun. 7-11, 2004, Paris, 4 pages.

Benitez et al. "High-Concentration Mirror-Based Kohler Integrating System for Tandem Solar Cells", WCPEC2006, 4 pages.

Terao, Akira "MicroDish: A Novel Reflective Optic for Flat-Plate Micro-Concentrator", SPIE's 49th Annual Meeting, Aug. 2-6, 2004, Denver, Colorado, USA, 9 pages.

(56) References Cited

OTHER PUBLICATIONS

Sun et al. "Modeling and Experimental Evaluation of Passive Heat Sinks for Miniature High-Flux Photovoltaic Concentrators", Transactions of the ASME, vol. 127, pp. 138-145 (2005).

Gordon et al. "Optical performance at the thermodynamic limit with tailored imaging designs", Applied Optics, in press, Dec. 2004, 16 pages.

Alvarez et al. "RXI Concentrator for 1000X Photovoltaic Energy Conversion", Proc. SPIE, vol. 3781, 30 (1999), 9 pages.

Swanson, Richard M. "The Promise of Concentrators", Prog. Photovolt. Res. Appl. 8, pp. 93-111 (2000).

Nguyen, Luu "Wafer Level Packaging for Analog/Mixed Signal Applications", MEPTEC Int. Wafer Level Packaging Conference, Aug. 22, 2002, 41 pages.

* cited by examiner

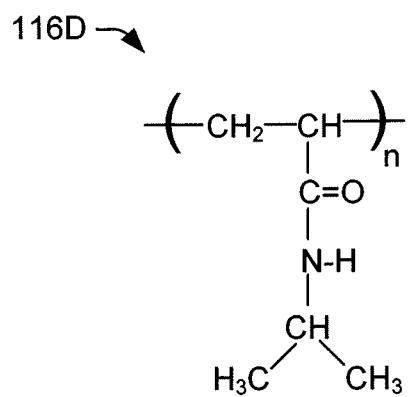
FIG. 8
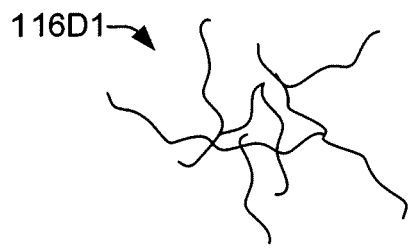
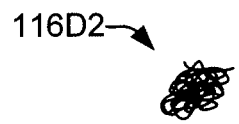
FIG. 9(A)        FIG. 9(B)

SOLAR ENERGY HARVESTING DEVICE USING STIMULI-RESPONSIVE MATERIAL

FIELD OF THE INVENTION

The present invention is directed to solar energy harvesting devices, and more particularly to waveguide-type concentrating solar energy harvesting devices in which a stimuli-responsive material (SRM), such as a phase-change material (PCM) having a lower critical solution temperature (LCST) slightly above room temperature, is dispersed in the waveguide material to form self-aligned light scattering structures.

BACKGROUND OF THE INVENTION

Photovoltaic (PV) cells are used to convert solar energy (sunlight) into electricity, and are typically implemented either in flat-panel arrangement, or in conjunction with concentrating solar collectors.

Solar Energy Harvesting Requires Inexpensive Large Area Components

Solar energy arrives at the surface of the earth as a relatively dilute form of radiant energy, peaking at approximately 1000 W/m$^2$. Any solar energy harvesting system is therefore required to cover a relatively large area in order to intercept enough sunlight for a meaningful power output. The intercepting area can consist of the energy converting components themselves (e.g., photovoltaic cells in a flat panel module) or consist of optical elements used to direct the intercepted light to a typically smaller converting component (e.g., a higher performance photovoltaic cell in a solar concentrator system). Due to the low price of electricity to which industrialized nations have become accustomed, the key techno-economic challenge and driver is to make the solar energy harvesting system very inexpensive per unit area.

Fabrication processes for photovoltaic cells (PV cells) have benefited from the mature status and sustained progress in semiconductor manufacturing techniques developed for the field of microelectronics. Although it can be expected that process improvements will continue to lower the cost of PV cells into the future, the often cited analogy with Moore's law in microelectronics is only partially appropriate: Moore's law rests heavily on a reduction in surface area per useful unit (e.g. a transistor), while the useful unit in a PV cell is surface area itself. The usefulness of the surface area can be modified in a first example by improving the efficiency of the PV cell, which—being an efficiency metric—naturally has fundamental limits forcing the progress trajectory into an S-curve, and is not the objective of this invention. The usefulness of the surface area can be modified in a second example by optical concentration. It is on of the objectives of this invention to achieve moderate concentration levels (e.g., 10× to 40×, or sometimes higher) with system components that can scale to very low cost and do not incur the system disadvantages typically associated with conventional solar concentrators.

Benefits of Solar Concentration

Historically, a single one of the beneficial aspects of low/medium concentration PV systems dominated the discussion: this dominant aspect was the paradigm of "saving silicon", which cannot be the only motivation anymore in times of low cost silicon feedstocks now available for PV cell production. Whether flat panel PV cells or PV cells working in somewhat concentrated light environments will form the mainstay of our futures solar energy systems is still heavily debated today. Extrapolations are subject high uncertainty due to the industrial network effects unfolding over time. While flat panel approaches may well win the race to grid parity, there are some important arguments to note in favor of concentrated approaches. These benefits are given here with a bias towards low/medium concentrators and receivers of similar complexity to crystalline silicon PV cells:

(1) A solar harvesting device having only a portion of the surface area consisting of fragile, electrically connected PV cells allows more degrees of freedom in the system design. These can be used to make the system more robust, flexible, easier to ship, partially translucent, building integrated, just to name a few possible directions. An economic degree of freedom is won by the fact, that a low/medium concentrator can make good use of higher efficiency cells (e.g. high efficiency silicon or similar), that might be temporarily or systematically not quite competitive for flat panel application under 1× sun.

(2) A large fraction of the capital expenditure of PV module manufacturing goes towards the fabrication machinery for PV cell manufacturing. Producing more total PV module area per year normally requires the installation of proportionally more machinery. This can limit the growth of such a technology and business domain, as the capital for expansion often is the limiting resource. Organic growth from reinvesting profits may be too slow for staying on top of competitors in the market or climate goals in the world. A concentration system can mitigate such capital imposed limits and allow faster scale-up in terms of GWp/year, since the electrical productivity of each cell leaving the (capacity limited) production line is increased by the flux concentration factor $F=Cg*\eta$ (where $\eta$ is the optical efficiency of the concentrator). Of course, this strategy only holds if the capital cost to obtain fabrication capacity for the optical concentrator is lower on a per Watt basis than the PV cell fabrication facility (fab). This is particularly true for optical concentration elements that can be manufactured on existing machinery. As explained below, systems described in this invention can be manufactured e.g. on fabrication lines similar to those used for building windows ("insulating glass units", IGUs). The optical focusing elements, particularly lenses, can be straightforwardly realized in multiple ways. As a first exemplary option, the low optical demands on the (non-imaging) topography allow to use simple "textured glasses" (e.g. verified with "Pilkington Cross Reed 0.5 inch" glass), which are produced at low cost for fenestration products. As a second exemplary option, the optical focusing elements can manufactured on film or foil manufacturing equipment, such as the microoptical film fabrication equipment that exists today for display backlighting films. These plants have an annual capacity in the hundreds of square kilometers per year. The ability to rapidly scale up production will become a particularly prominent competitive differentiator, as soon as solar energy first undercuts the costs of established fossil fuel based generation.

(3) Concentrator photovoltaics can drastically reduce the embodied energy in the solar energy harvesting system per peak Watt installed when compared to flat panel PV cells. This shortens the energy payback time of the system and similarly the "energy returned on energy invested".

(4) Returning to the initial point made above, a low/medium solar concentrator with good manufacturability can reduce the cost per installed W compared to flat panel systems, if disadvantages of prior art concentrators (such as tracking requirements) are avoided.

Passive Optical Concentrators in the Prior Art

Prior art solar concentrators utilize optics (e.g., reflectors, lenses, etc.) to focus sunlight onto a relatively small PV cell. This can be motivated by direct cost savings (e.g., when the area specific cost of the optics is lower than the cost of the PV cell), and/or by the desire for higher system efficiencies (e.g., by allowing to use high performance PV cells that are only available and economic in small areas).

In prior art passive optical systems, concentration typically leads to the requirement of mechanical tracking. The roots for this causation are of fundamental physical nature, and can be outlined as follows: Concentration in the spatial domain comes at the expense of an expansion in the angular domain. This is mandated by principles of conservation of phase space (i.e., Etendue). The concentration sought from a solar concentrator is a concentration in the spatial domain: The energy intercepted at a large area aperture is coupled to a small area receiver (photovoltaic or thermal) having a surface area that is smaller by a factor Cg. This causes the solid angle subtended by the incoming radiation to expand by the incoming radiation to expand by approximately the same factor (modified by the refractive index contrast and projection direction) before it reaches the smaller receiver. However, the solid angle from which a receiver can accept light is typically limited to $2\pi^2$ (hemispherical space) or in some cases to the absolute limit of the full sphere at $4\pi^2$. This limits the solid angle from which a concentrator can efficiently accept incoming radiation at its input. However, even direct sunlight originates over the course of year from within a significant portion of the sky hemisphere. The acceptance solid angle starts to become restricted to a solid angle zone narrower than this even for very low spatial concentration factors Cg, e.g. 3×. This can be improved upon by optimizing for the particular angular intensity distribution, but passive static systems beyond 10× concentration are impractical on earth.

It should be noted that the direct sunlight itself subtends only a very small solid angle at any given time. Based on this, prior art systems are able to efficiently reach higher concentration factors by going from static (untracked) systems to tracked concentrators. These tracking systems keep the relative angular position between the sun and the concentrator substantially constant in one or two of the angular dimensions; typically by mechanical movement of the systems. Mechanical tracking systems add installation cost, maintenance cost, reliability concerns, windloading problems and other disadvantages to the system. A system that achieves higher concentration factors than static concentrators without mechanical tracking is therefore highly desirable.

Luminescent Solar Concentrators in the Prior Art

A Luminescent Solar Concentrator (LSC) allows concentration without tracking of both diffuse and direct radiation and have been described in the prior art. LSCs overcome the single wavelength Etendue limits that constrain passive optical concentrators by subjecting each photon to a downward shift in energy (towards longer wavelength), e.g. via a fluorescence process. The photon energy difference is required for compliance with the governing thermodynamic principles and enables concentration factors well beyond the domain to which static concentrators are limited otherwise.

Luminescent Concentrators (LSCs) are designed to achieve a result similar to the present invention (concentration without tracking), but via a very different route: To capture the incident light, they rely on luminescent materials. The present invention does not rely on luminescent materials, but instead uses a self adaptive strategy with materials that are optically passive. After the emitted light (or scattered light respectively) is captured by total internal reflection in the lightguide, the same broad range of options to outcouple and utilize it are applicable again.

Particularly for devices integrated into building envelopes, there are two important aspects that favor the approach of the present invention over LSCs:

(1) This approach selectively couples the direct component of sunlight, while letting the diffuse daylight component pass. Thus, the two components can be handled separately (e.g. direct light used for pv electricity, diffuse light used for room lighting). The absorption in an LSC doesn't differentiate between the two angularly distinct light components, and therefore does not offer the degree of freedom offered here.

(2) While LSCs can in principle be made to exhibit a color-neutral spectrum in the residual light transmitted and their appearance, this is practically quite challenging to achieve. Since the present invention does not rely on any mechanism that (like luminescence) affects the wavelength of a captured photon, color neutrality is achieved without special consideration. This is desirable for building integrated applications.

Waveguide-Type Solar Concentrators

FIG. 13(A) shows a recently introduced solar energy capturing system 60 proposed by Karp et al. (see WO20/0/033859, "SYSTEM AND METHOD FOR SOLAR ENERGY CAPTURE AND RELATED METHOD OF MANUFACTURING" that includes a waveguide (lightguide) component 61. Contrasting to e.g. luminescent solar collectors, system 60 employs a waveguide component 61 from a clear, non-luminescent material (e.g., glass or suitable plastic, such as PMMA or PC), and utilizing a lens array 70 having a plurality of lenses 75 to focus sunlight SL onto an array of prism/mirrored facets 68 arranged along at least one surface (e.g., lower surface 64) of waveguide component 61. That is, as illustrated in FIG. 13(A), incident sunlight SL directed through upper surface 71 of array 70 is focused by lenses 75, and the focused sunlight FSL is directed through upper surface 62 of waveguide component 61 onto prism/mirrored facets 68. Waveguide component 61 is formed such that reflected sunlight RSL, which is the focused sunlight FSL that is reflected back toward upper surface 62 by prism/mirrored facets 68, is directed to remain in component 61 by internal reflection from the waveguide surfaces 62 and 64. The system further includes at least one photovoltaic cell 50 positioned so as to receive at least a portion of the reflected sunlight RSL.

FIG. 13(B) illustrates a problem associated with the solar energy capturing system 60. In particular, when incident sunlight SL is directed at a non-optimal angle onto lens array 70, the focused sunlight FSL is directed away from prism/mirrored facets 68, thereby preventing reflected sunlight from being captured within waveguide component 61. One approach for avoiding this problem is to provide a tracking system that repositions system 60 as the sun moves across the sky, but this solution suffers the problems described above with the cost and complication associated with the tracking system. It should be noted that mechanically tracked PV systems are very difficult to integrate into building envelopes, due to the motion requirements, aesthetics and wind load considerations. Tracking with 2 degrees of freedom (as is a requirement with the prior art system 60) is particularly challenging, since at least the second degree of freedom will cause the device to rotate out of plane. In the presence of wind, it is costly to support a large area element that is out of plane, instead of being flush with the structure.

Another approach would be to increase the size and/or modify the shape of prism/mirrored facets 68 such that the focused sunlight remains directed onto facets 68 throughout the day. However, this approach requires covering a significant portion of the waveguide surfaces with facet structures, which impedes internal reflection and thus reduces the amount of reflected sunlight that is successfully guided along waveguide component 61 to photovoltaic cells 50. Achieving acceptance angles large enough to avoid tracking requirement, while providing sufficient concentration levels and optical efficiency is not feasible in this way.

What is needed is a solar energy harvesting device that provides the advantages of a lightguide-type (waveguide-type) solar concentrator, but avoids the alignment/tracking requirement associated with existing prior art devices.

SUMMARY OF THE INVENTION

The present invention is directed to a lightguide-type solar energy harvesting device that avoids the alignment/tracking associated with existing prior art lightguide-type (waveguide-type) solar devices by utilizing a stimuli-responsive material (SRM) disposed in a lightguide (waveguide) structure that generates light scattering structures wherever solar radiation (sunlight) is concentrated in a sufficient amount. The solar energy harvesting device includes the SRM-bearing lightguide structure, a solar radiation (sunlight) concentrating member (e.g., a lens array) disposed to concentrate sunlight within the lightguide, and a solar energy receiver (e.g., a PV cell) positioned to receive at least a portion of the captured sunlight exiting the lightguide. According to an aspect of the present invention, the SRM is evenly distributed throughout the lightguide material layer, which is otherwise substantially transparent, and the solar radiation concentrating member is formed and arranged such that the sunlight is focused (concentrated) at one or more focal points located inside the lightguide. According to another aspect of the invention, the SRM is characterized by assuming a relatively high transparency (first) state in the absence of direct sunlight, and by a changing to a relatively opaque (second) state when subjected to a predetermined amount concentrated solar radiation (i.e., solar energy in the form of heat or light). In the preferred embodiment, the lightguide structure is formed such that only a relatively small portion (e.g., 1% to 10% of the cross-sectional area) of the SRM in the material layer changes from the relatively transparent first state to the opaque second state, where the portion is disposed in "focal zone" regions that surround or are otherwise disposed adjacent to each focal point defined by the sunlight concentrating member. By positioning the sunlight concentrating member (e.g., lens array) to focus sunlight at focal points disposed inside the lightguide material layer, and by distributing the SRM evenly throughout the material layer, the device effectively provides a self-aligning mechanism in that light scattering regions are generated in any portion of the lightguide material layer that coincides with the focal points for the current incidence direction, thereby minimizing manufacturing costs by avoiding the need for alignment (both initial and tracking during operation to follow the apparent motion of the sun) between the light concentrating member and fixed points on the lightguide.

According to an embodiment of the present invention, the SRM is distributed in the lightguide material layer in suitable amount such that the SRM (and, hence, the lightguide material layer) remains substantially entirely transparent to solar radiation in the first state, and such that, when the portion of the SRM located in the focal zones is in the opaque/scattering (second) state, at least 40% of the concentrated solar radiation directed into the focal zone is redirected by the changed/opaque portion into the remaining unchanged/transparent portion of the lightguide material layer. In addition, the upper and lower boundary surfaces of the lightguide material layer are essentially entirely smooth (e.g., flat, planar, or otherwise devoid of structures such as the prism/mirrored facets utilized in prior art lightguide-type solar devices), whereby a large portion of the redirected concentrated solar radiation that is scattered or otherwise redirected from the changed/opaque SRM portion is temporarily retained within the lightguide structure by total internal reflection (TIR) between the upper and lower boundary surfaces. That is, the use of SRM to selectively generate the opaque/scattering structures within the lightguide material layer eliminates the need for the prism/mirrored facets utilized in the prior art, thereby maximizing the effectiveness of the lightguide structure to transmit the captured sunlight to the solar receivers. The amount of captured sunlight transmitted by TIR to the solar receivers is further enhanced by distributing the SRM in the lightguide material layer in a suitable amount that generates minimally sized opaque/scattering portions in the focal zones surrounding each focal point, whereby the percentage of the lightguide material that remains in the transparent state is maximized to maximize the amount of sunlight transmitted from the lightguide to the solar receivers.

According to another aspect of the present invention, the SRM is further characterized such that the SRM portion disposed in the focal zone reverses (changes back) from the opaque/scattering (second) state to the transparent (first) state when the concentrated solar radiation at the focal points subsequently decreases from a high radiation amount back to a low radiation amount. By utilizing an SRM that is reversible, the self-aligning feature of the present invention is further enhanced in that the changed/opaque SRM portion is automatically repositioned within the lightguide material layer throughout the day without requiring repositioning or tracking structures. Moreover, because the state of the SRM is reversed to a transparent (non-scattering) form when the concentrated solar radiation is no longer present, the lightguide structure is characterized by becoming substantially entirely transparent to diffuse light.

According to yet another aspect of the present invention, the light concentrating member includes an array of optical elements that are fixedly positioned relative to the lightguide structure and positioned such that the focal point defined by each optical element remains located inside the lightguide material layer throughout the daylight hours. That is, those skilled in the art will recognize that the effective focal point of an optical element is determined in part by the incident angle of the focused light (e.g., the angle of the incident sunlight). In accordance with this aspect of the invention, the concentrating member is positioned relative to the lightguide structure such that the effective focal point of the one or more optical elements remains inside the lightguide material layer for any incident sunlight direction. With this feature, an inexpensive fixed lens-type concentrating optical system (e.g., a molded glass or plastic lens array) can be used as the light concentrating member by forming the lightguide with suitable thickness and positioning the optical system such that a nominal focal point of the various lenses is located in the middle of the lightguide material layer, whereby variations in the focal length of the individual lenses and changes in the effective focal lengths throughout the daylight hours are accounted for by providing a suitably thick material layer. With varying angles of incidence, such axial shifts of the focal point have to be expected; particularly with refractive lens arrays, that are amongst the most straightforward to implement, but exhibit field curvature which causes the shift.

According to an embodiment of the present invention, the lightguide structure includes a first transparent layer and a second transparent layer with the SRM-bearing material layer being sandwiched therebetween. The first and second transparent layers are formed using a solid light transparent material (e.g., glass or clear plastic), with the outward-facing surface of the first transparent layer forming the upper (first) surface of the lightguide. The outward-facing surface of the second transparent layer forms the lower (second) surface of the lightguide. Disposing the SRM-bearing lightguide material layer between the transparent layers facilitates forming the lightguide material layer optionally as a liquid or gel, which minimizes manufacturing costs while maximizing the durability of the device.

In one embodiment the SRM-bearing material layer includes a mixture of a transparent gel/liquid carrier material and a temperature dependent SRM material that is dispersed in the carrier material. In a preferred embodiment the SRM material has a lower critical solution temperature (LCST) in the range of 30° C. and 90° C., and in a specific preferred embodiment the SRM-bearing material layer includes poly (N-isopropylacrylamide) (PNIPAM) disposed in water.

In another preferred embodiment, the SRM is selected such that the focal zone has a transparent state with a linear optical attenuation coefficient below $1.00\ cm^{-1}$ when the SRM is in the transparent (first) state, thereby providing suitable conditions for transmitting light (both scattered light from other portions and diffuse light).

In another preferred embodiment, the SRM is selected such that the focal zone has a refractive index greater than 1.34 at 600 nm when the SRM is in the opaque/scattering (second) state, thereby providing suitable conditions for scattering the concentrated solar radiation (sunlight) through the remaining portion of the lightguide material layer that remains unchanged (i.e., in the transparent (first) state).

In another embodiment, the SRM comprises a phase change material (PCM) disposed in said transparent gel or liquid carrier material, wherein said PCM is characterized by assuming a first molecular structure in the transparent (first) state, and by assuming a second molecular structure in the opaque/scattering (second) state. In one specific embodiment the PCM material is a temperature-responsive polymer characterized by assuming a hydrated first molecular structure while a temperature of the solution in the focal zone remains below a predetermined LCST temperature (e.g., in the range of 30° C. and 90° C.), and by changing to a dehydrated second molecular structure when the concentrated solar radiation increases the temperature of the solution in the focal zone above said LCST temperature. Preferably, the PCM material is further characterized by transitioning from the dehydrated molecular structure back to the hydrated molecular structure when the solution temperature is reduced from above the LCST temperature to below the LCST temperature. In a specific embodiment, the PCM material comprises one of poly (N-isopropylacrylamide) (PNIPAM) and Methyl-Cellulose.

In yet another specific embodiment, the SRM is a photochromic material (e.g., Spiropyrans, amongst the many other photochromics that have been developed and are well known) that is characterized by assuming a first chemical state having a light or clear color in the transparent (first) state, and by assuming a second chemical state having a dark color in the opaque/scattering (second) state, where the dark colored state is substantially less transparent than the light colored state. It should be noted that a dark colored second state is not preferred for an application where the main objective is the generation of electricity via photovoltaics. However, it can be a desirable property for controlling the amount of sunlight passed, if integrated into a building as detailed below.

In yet another specific embodiment, the SRM-bearing material layer mixture further includes one or more of a radiation-absorbing dye, a defoaming agent, a thickening agent, and an anti-freeze agent. The optional absorbing dye (e.g., NIR980A by QCR Solutions) is preferably only absorptive at wavelengths greater than 1000 nm, and assists with light absorption to create the necessary focal heating. The optional defoaming agent (e.g., Poly-Ethylene-Glycol (PEG)) is provided to assist with filling during manufacturing. The optional thickening agent (binder, e.g., a commercial cellulose derivative such as HPMC) is provided to suppress convective heat transport, thereby enhancing the desired temperature contrast between the hot focal zone and the cooler surrounding material. An optional anti-freeze agent may be added.

In yet another specific embodiment, the SRM-bearing material layer mixture is in a solid form and the transparent layers are omitted (i.e., the upper and lower surfaces of the SRM-bearing material layer form the upper and lower surfaces of the lightguide structure).

In yet another embodiment, the light concentration member includes an array of focusing elements (e.g., lenses or mirrors) disposed such that each of the focusing elements generates an associated focal point inside of the SRM-bearing material layer. In one specific embodiment, a lens array including multiple lens structures disposed in a planar arrangement such that each of the lens structures generates an associated focal point that is located inside of the lightguide structure. The benefit of this arrangement is that the lens arrays can be formed using low-cost molded glass or plastic sheets that also serves as a weather resistant outer layer for the device. In a specific embodiment, each of said plurality of lens structures causes a spatial light concentration in some plane of 3× or greater, even more preferably greater than 5×, and yet even more preferably greater than 10×, or preferably beyond. In a specific embodiment, the focal point of each of said plurality of lens structures is positioned within a central 90% portion of the lightguide material layer, and even more preferably located within a central 50% portion of the lightguide material layer. In another specific embodiment, the outer surface of the lens array is flat (planar) to facilitate cleaning and other maintenance. Moreover, forming a lens array separate from the lightguide structure facilitates providing a necessary offset gap between the lightguide structure and the light concentrating structure, which is needed to generate TIR inside the lightguide structure. The offset gap is characterized by being filled with a material that has a pronouncedly lower refractive index than the SRM-bearing material. This is commonly air or inert gas or vacuum. However, other options include aerogels and other known low index solids. It should be noted that methods exist today, to increase the refractive index of a material, e.g. by dispersion sub-wavelength particles of a high refractive index material. If such a method was employed to increase the refractive index of the SRM-bearing material substantially, then it would be possible to provide the offset gap from a more common solid material, including polymers, such as silicones.

According to another embodiment of the present invention, the device further includes a rigid frame connected to the peripheral edges of the concentrating means and the lightguide structure such that the concentrating means is maintained at a predetermined gap distance from the upper surface of the lightguide structure. By providing the frame with suitable mounting grooves, the frame both facilitates accurate and inexpensive device assembly, and maintains the necessary gap needed to facilitate TIR in the lightguide structure. In one embodiment the solar energy receiver is also mounted on the frame and disposed along a peripheral edge of the lightguide structure such that the solar energy receiver extends at least a portion of the distance between the upper and lower boundary surfaces of the lightguide structure. In alternative embodiments the solar energy receiver comprises one of a photovoltaic converter and a solar thermal device operably arranged to receive the redirected solar radiation passing out of the peripheral edges of the lightguide structure.

According to another aspect of the present invention, because a majority of the lightguide structure remains substantially entirely transparent to diffuse light, and because the SRM disposed in the focal zones changes to the opaque/scattering state such that direct sunlight is prevented from passing through the lightguide structure, the solar energy harvesting device is able to serve a secondary purpose as a self-adjusting solar transmission "skylight" apparatus on a residence or other building structure. That is, in addition to generating electricity or other converted solar energy, when mounted in place of a conventional skylight, the device serves to block most of the direct sunlight from passing through the apparatus and into the interior space disposed under the skylight/device, thereby preventing undesirable high radiance areas, attenuating fluctuations of the lighting level, preventing excessive solar heating, thereby reducing air conditioning costs, while allowing a significant amount of diffuse light to enter the interior space, thus reducing lighting costs.

BRIEF DESCRIPTION OF THE DRAWINGS

These and other features, aspects and advantages of the present invention will become better understood with regard to the following description, appended claims, and accompanying drawings, where:

FIG. 8 is a chemical diagram for poly(N-isopropylacrylamide) (PNIPAM), which is utilized as an SRM material in accordance with a specific embodiment of the present invention;

FIGS. 9(A) and 9(B) are simplified sketches depicting a PNIPAM molecule in first and second states, respectively;

DETAILED DESCRIPTION OF THE DRAWINGS

The present invention relates to a modified lightguide-type (waveguide-type) solar energy harvesting device in which a stimuli-responsive material (SRM) is evenly distributed throughout the waveguide material layer. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the teens "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
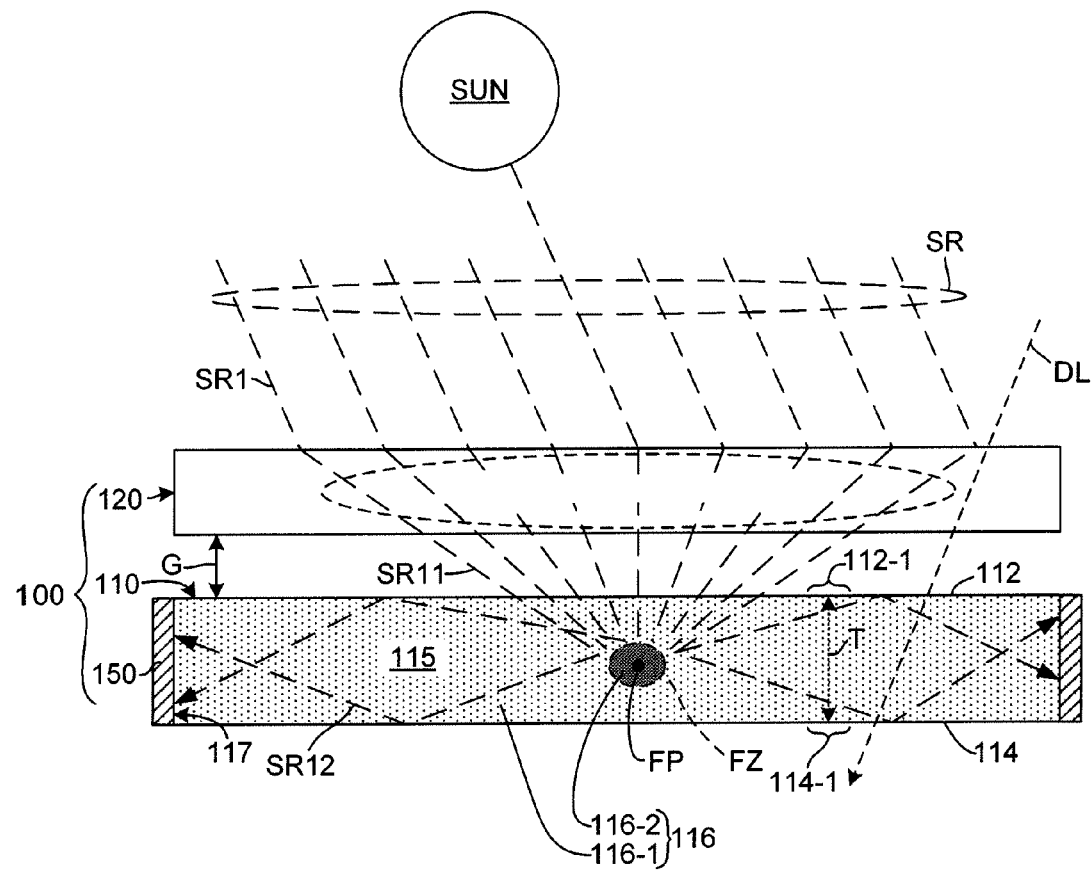
FIG. 1 is a simplified cross-sectional side view showing a solar energy harvesting device in accordance with a generalized embodiment of the present invention.

FIG. 1 is a simplified cross-sectional side view showing a solar energy harvesting device 100 in accordance with a generalized embodiment of the present invention. Solar energy harvesting device 100 is similar to conventional lightguide-type solar energy harvesting devices a lightguide (waveguide) structure 110, a solar radiation (sunlight) concentrating member (e.g., a lens array) 120 disposed to concentrate sunlight within lightguide 110, and a solar energy receiver (e.g., a photovoltaic (PV) cell) 150 positioned to receive at least a portion of the captured sunlight exiting lightguide structure 110.

Referring to the upper portion of FIG. 1, lightguide structure 110 includes an upper (first) boundary surface 112 and an opposing lower (second) boundary surface 114, and a peripheral side edge 117 that extends between upper boundary surface 112 and lower boundary surface 114. Upper boundary surface 112 and lower boundary surface 114 are locally parallel in the sense that opposing regions (e.g., 112-1 and 114-1), which are separated by a thickness T formed by perpendicular lines extending between both regions, are substantially parallel to each other. In one specific embodiment, both upper boundary surface 112 and lower boundary surface 114 are entirely planar and parallel to each other. In another embodiment lightguide structure 110 is a dome-shaped structure wherein upper boundary surface 112 and lower boundary surface 114 are curved surfaces, but remain separated by thickness T at all points.

Sunlight concentrating member 120 is fixedly disposed relative to the lightguide structure and serves to concentrate parallel solar radiation beams SR that are directed onto device 100 such that the solar radiation is concentrated at one or more focal points FP disposed inside material layer 115. That is, unlike prior art lightguide-type solar energy harvesting devices that direct light onto prism facets (or imaginably other fixedly provided coupling targets on a surface), sunlight concentrating member 120 focuses incident solar radiation beams SR such that focused solar radiation beams (e.g., solar radiation beam SR11) converge at focal point FP that is disposed between upper boundary surface 112 and lower boundary surface 114 (e.g., at a midpoint between upper boundary surface 112 and lower boundary surface 114).

According to an aspect of the present invention, lightguide structure 110 further includes a material layer 115 including a stimuli-responsive material (SRM) 116 that is evenly distributed throughout material layer 115 (i.e., substantially equal concentrations of SRM 116 are found in every region of material layer 115). SRM 116 is characterized in that all SRM 116-1 and 116-2 disposed in material layer 115 assumes a substantially transparent (first) state when material layer 115 is subjected to a relatively low (first) amount of concentrated solar radiation, and further characterized in that a portion 116-2 (e.g., a region approximately representing 1% to 10% of the cross-sectional area or volume of material layer 115) of SRM 116 that is disposed in a focal zone FZ adjacent to each focal point FP changes from the substantially transparent state to a relatively opaque state (indicated by the relatively dark shading inside focal zone FZ) when the concentrated solar radiation at focal point FP increases from a low radiation (first) amount to a predetermined high radiation (second) amount, while a remaining SRM portion 116-1 (i.e., the portion of SRM 116 in material layer 115 disposed outside focal zone FZ) remains in the transparent state (indicated by the light shading outside of focal zone FZ). The opaque/scattering state of portion 116-2 in FIG. 1 is more opaque (i.e., having a low likelihood of light passing through without being changed in angle and/or intensity) than remaining portion 116-1 that is in the transparent state, whereby concentrated solar radiation directed into focal zone FZ is redirected by SRM portion 116-2, and the redirected solar radiation (e.g., solar radiation beam SR12) is transmitted through the remaining SRM portion 116-1 that remains in the transparent (first) state. In a preferred embodiment, SRM 116 is further characterized by having light scattering characteristics such that concentrated solar radiation SR directed into focal zone FZ when portion 116-2 is in the opaque/scattering (second) state is at least ten times more likely to be scattered into remaining portion 116-1 (e.g., as depicted by solar radiation beam SR12) as to be absorbed by SRM portion 116-2 in said focal zone.

Referring again to FIG. 1, solar energy receiver 150 is depicted as being positioned along peripheral edge 117 to receive redirected concentrated solar radiation (e.g., solar radiation beam SR-12) that is transmitted through remaining SRM portion 116-1. Although solar energy receivers in the present application are preferably fixedly connected to peripheral edge 117 of lightguide structure 110, in an optional embodiment a solar energy receiver may be fixedly positioned away from lightguide structure 110, and lightguide structure 110 is modified to include an outcoupling optical structure similar to that disclosed in co-owned and co-pending U.S. patent application Ser. No. 12/853,266 ("LUMINESCENT SOLAR CONCENTRATOR WITH DISTRIBUTED OUTCOUPLING STRUCTURES AND MICROOPTICAL ELEMENTS"), which is incorporated herein by reference in its entirety, or is otherwise arranged such that the solar radiation transmitted through lightguide structure 110 is directed onto solar energy receiver 150.

As set forth above, solar energy harvesting device 100 is distinguished over conventional lightguide-type solar devices in that, by positioning sunlight concentrating member 120 to focus incident sunlight beams SR at one or more focal points FP disposed inside lightguide structure 110, and by distributing SRM 116 evenly throughout material layer 115, device 100 effectively provides a dynamic self-aligning mechanism in which light scattering "structures" are automatically generated in any region of lightguide material layer 115 that coincides with focal points FP, thereby minimizing manufacturing costs by avoiding the need for alignment (both initial and daylight tracking) between light concentrating member 120 and fixed structures (e.g., prism facets) that are disposed on a surface of lightguide structure 110.

Figure 2:
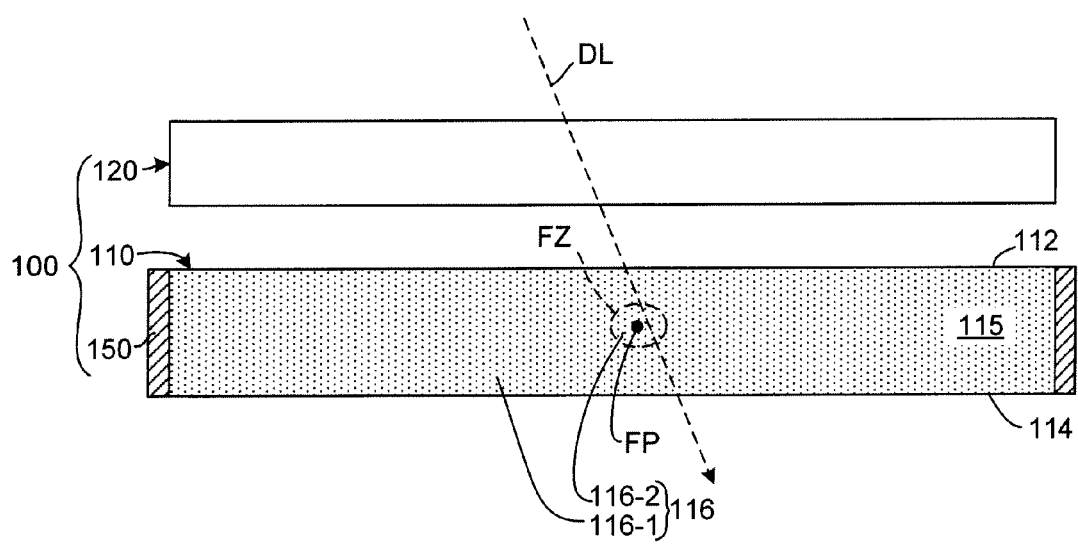
FIG. 2 is a simplified cross-sectional side view showing the solar energy harvesting device of FIG. 1 in the absence of direct sunlight.

According to an embodiment of the present invention, SRM 116 is distributed in a substantially transparent material that otherwise forms lightguide material layer 115, and is provided in suitable amount to produce optimal light scattering characteristics within device 100. That is, an optimal amount of SRM material 116 is disposed in material layer 115 such that, as indicated in FIG. 1, when SRM portion 116-2 in focal zone FZ is in the opaque/scattering (second) state, at least 40% of the concentrated solar radiation SR directed into focal zone FZ is scattered by SRM portion 116-2 into the remaining unchanged/transparent portion 116-1. At the same, the optimal amount SRM material 116 is selected such that, as indicated in FIG. 2, all SRM 116 (i.e., both portion 116-2 disposed inside focal zone FZ and remaining portion 116-1 disposed outside focal zone FZ) remains substantially transparent to solar radiation in the transparent (first) state and, hence, the entirety of lightguide material layer 115 remains substantially entirely transparent to solar radiation when the SRM is in the first state). That is, material layer 115 is formed such that, when SRM 116 is in its transparent state, the material in material layer 115 remains transmissive to a substantial fraction (i.e., 75% or more) of the wavelength band usable by solar receiver 150. For example, when receiver 150 is implemented by a c-Si photovoltaic cell, light in the wavelength band including 400 nm to 1000 nm is transmitted. Similarly, when receiver 150 is implemented by a multi-junction photovoltaic cell, it is desirable to transmit light in the wavelength band including 300 nm to 1500 nm if possible from the materials involved, and it would be desirable to transmit the wavelength band including 300 nm to 2500 nm for a thermal receiver, although many SRM materials will not be transparent to radiation above 1500 nm. Although these transmission ranges are currently believed to be ideal, the present inventors currently believe that lightguide material layers formed in accordance with most realizations of this invention utilizing a heat induced SRM will be preferably designed to absorb at least the received portion above 1000 nm (c-Si cutoff) to create focal heating that is used to change the SRM from its transparent state to its opaque/scattering state.

Figure 3A:
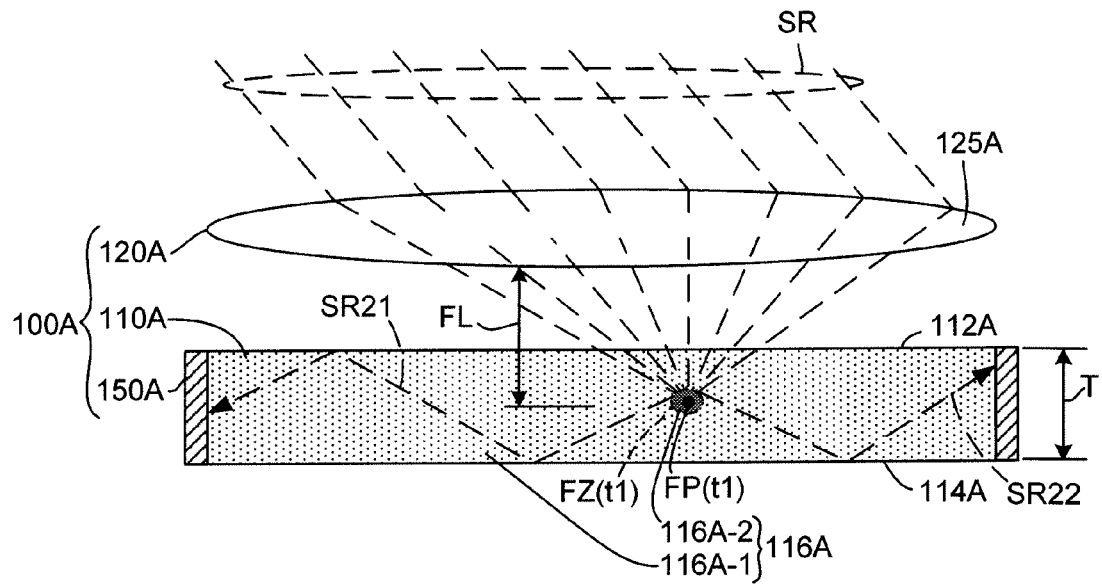
FIGS. 3(A) and 3(B) are simplified cross-sectional side views showing a portion of a solar energy harvesting device according to a first specific embodiment of the present invention during operation.
Figure 3B:
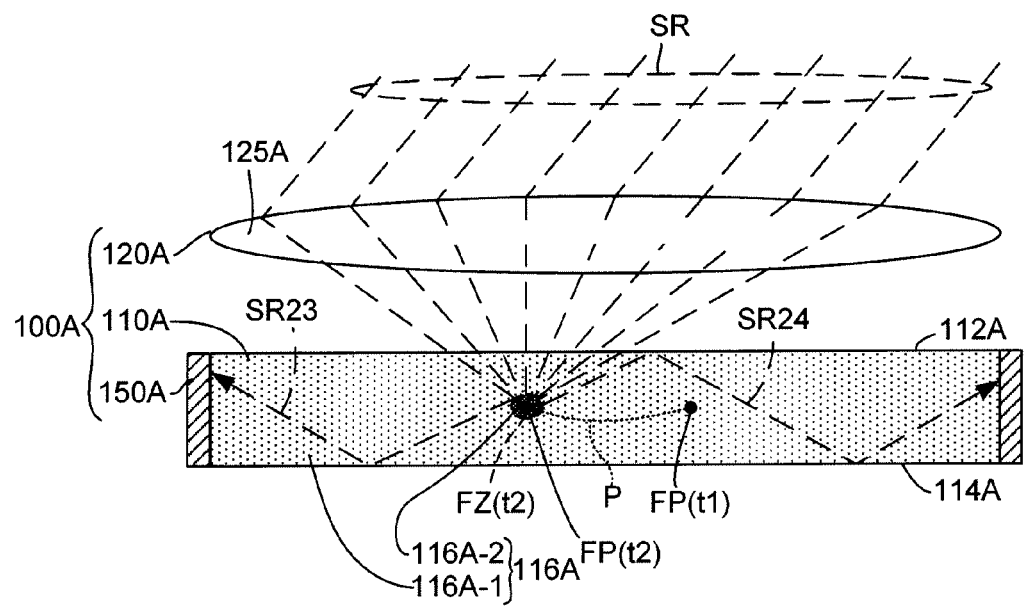

FIGS. 3(A) and 3(B) are simplified cross-sectional side views showing a portion of a solar energy harvesting device 100A according to a first specific embodiment of the present invention. Device 100A is similar to the generalized embodiment described above with reference to FIGS. 1 and 2, and therefore related structures are identified with similar reference numbers (modified to include the suffix "A"). Device 100A is characterized from the generalized embodiment in the following respects.

First, upper boundary surface 112A and lower boundary surface 114A of lightguide material layer 115A are characterized as being essentially entirely smooth (e.g., flat, planar, or otherwise devoid of structures such as the prism/mirrored facets utilized in prior art lightguide-type solar energy harvesting devices), whereby a large portion of the redirected concentrated solar radiation that is scattered or otherwise redirected from SRM portion 116A-2 is temporarily retained within lightguide structure 110 by total internal reflection (TIR) between upper boundary surface 112A and lower boundary surface 114A (e.g., as depicted by arrows SR21 and SR22 in FIG. 3(A)). As such, device 100A functions similar to conventional lightguide-type solar energy harvesting devices by utilizing a lightguide (waveguide) structure to direct captured sunlight to peripherally disposed solar receivers 150A, but in this case the use SRM 116A to selectively generate the opaque/scattering structures (i.e., portion 116A-2) within lightguide material layer 115A eliminates the need for the prism/mirrored facets utilized in prior art. The amount of captured sunlight transmitted by TIR to solar receivers 150 is further enhanced by distributing SRM 116A in the lightguide material layer in a suitable amount that minimizes the size of opaque/scattering portions 116-2 in focal zones FZ, whereby the percentage of SRM 116A in lightguide material layer 115A that remains in the transparent state is maximized, which in turn maximizes the amount of sunlight transmitted from lightguide structure 110A to solar receiver 150A.

According to another aspect of the second embodiment, SRM 116A is further characterized in that portion 116A-2 disposed in the focal zone FZ reverses (changes back) from the opaque/scattering (second) state to the transparent (first) state when the concentrated solar radiation at focal point FP subsequently decreases from a high radiation amount back to a low radiation amount. For example, referring back to FIGS. 1 and 2, when the sun shown in FIG. 1 becomes obscured (e.g., by clouds), producing the situation shown in FIG. 2, the amount of concentrated solar radiation SR directed into focal zone FZ decreases. According to the current aspect, if the reduction in concentrated solar radiation is large enough, SRM portion 116A-2 reverts from the opaque/scattering (second) state to the transparent (first) state (indicated by the light shading in focal zone FZ in FIG. 2) until such a time as the solar radiation is again high enough to again reverse the state of SRM portion 116-2.

Another benefit of this invention arises from the fact that only a small volume fraction (in the focal zone) of the SRM is heated to change its state. The low thermal capacity of the small volumes allows short heat up times. Their large surface to volume ratio allows short cool down times, where the heat is dissipated quickly to the surrounding bulk SRM. Together, this enables a faster response to fluctuating sunlight conditions, than could be envisaged with a system where the bulk SRM layer as a whole undergoes a similar change of optical properties. Thereby, a room daylit through the device experiences significantly reduced objectionable fluctuations in illumination level.

Referring to FIGS. 3(A) and 3(B), by utilizing an SRM that is reversible in the manner described immediately above, the self-aligning feature of the present invention is further enhanced in that the opaque/scattering SRM portion is automatically repositioned within lightguide material layer 115 throughout the day without requiring repositioning or tracking structures. That is, as indicated in FIG. 3(A), where light concentrating member 120A is depicted by a single lens 125A, at a time t1 when solar radiation SR is directed onto lens 125A at a first incident angle, the received sunlight is directed toward an effective focal point FP(t1) in a first region of material layer 115A, whereby light-scattering SRM portion 116A-2 is generate in a first focal region FZ(t1) surrounding effective focal point FP(t1). FIG. 3(B) depicts device 100A later in the day (time t2) when solar radiation SR is directed onto lens 125A at a second incident angle, and the received sunlight is directed by lens 125A toward an effective focal point FP(t2) in a second region of material layer 115A, whereby light-scattering SRM portion 116-2 is generated in a second focal region FZ(t2) surrounding effective focal point FP(t2). Because the state of SRM 116A is reversed to a transparent (non-scattering) form when the concentrated solar radiation is no longer present, light-scattering SRM portions 116A-2 formed earlier in the day (e.g., shown in focal zone FZ(t1) in FIG. 3(A)) are eventually changed back to the transparent state and replaced with light-scattering SRM portions 116A-2 formed later in the day (e.g., shown in focal zone FZ(t2) in FIG. 3(B)). As such, the light-scattering SRM portion 116A-2 in effect "moves" through material layer 115A (e.g., as depicted by dashed line P in FIG. 3(B)) as the sun's position changes during daylight hours, thus both providing a self-aligned the light scattering structure and maintaining optimal light transmitting conditions within material layer 115A.

According to yet another aspect of the present embodiment, optical elements 125A of light concentrating member 120A is positioned such that the focal point FP remains located inside the lightguide material layer 115A throughout the daylight hours. That is, those skilled in the art will recognize that the effective focal points FP(t1) and FP(t2) (see FIGS. 3(A) and 3(B)) of fixed, lens-type optical element 125A is determined in part by the incident angle of the focused light (e.g., the angle of the incident sunlight SR). In accordance with this aspect of the invention, concentrating member 120A is positioned relative to the lightguide structure 110 such that the effective focal point of element 125A remains inside lightguide material layer 115A for any incident sunlight direction. With this feature, concentrating member 120A may be implemented using an inexpensive fixed lens-type array, for example, by providing each element 125A with a sufficiently long nominal focal length FL, and by providing lightguide structure 110A with a sufficient thickness T such that a nominal focal point of the various elements can be easily positioned inside the lightguide material layer (i.e., in the thickness direction), whereby variations in the focal length of the individual elements and changes in the effective focal lengths throughout the daylight hours do not produce focal points located outside of lightguide structure 110A (i.e., above upper boundary surface 112A or below boundary surface 114A).

Figure 4:
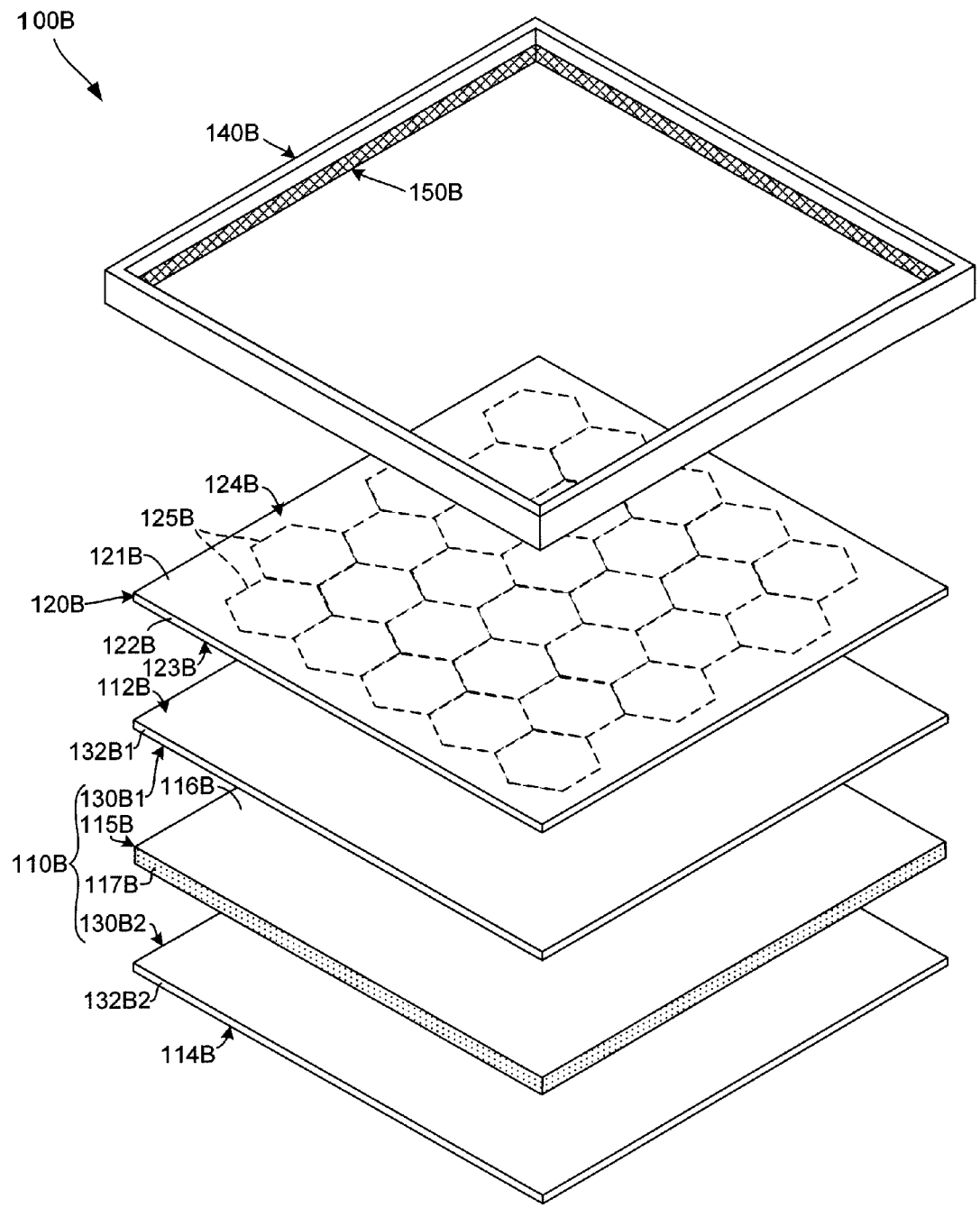
FIG. 4 is an exploded top perspective view showing a portion of a solar energy harvesting device according to a second specific embodiment of the present invention.

FIG. 4 is an exploded top perspective view showing a portion of a solar energy harvesting device 100B according to a second specific embodiment of the present invention. Device 100B is similar to the earlier embodiments in that it includes a lightguide structure 110B and a lens array (solar radiation concentrating member) 120B. In addition, device 100B includes a frame 140B that supports a solar energy receiver (e.g., a photovoltaic (PV) cell) 150B and is connected to the remaining components as described below.

Figure 5:
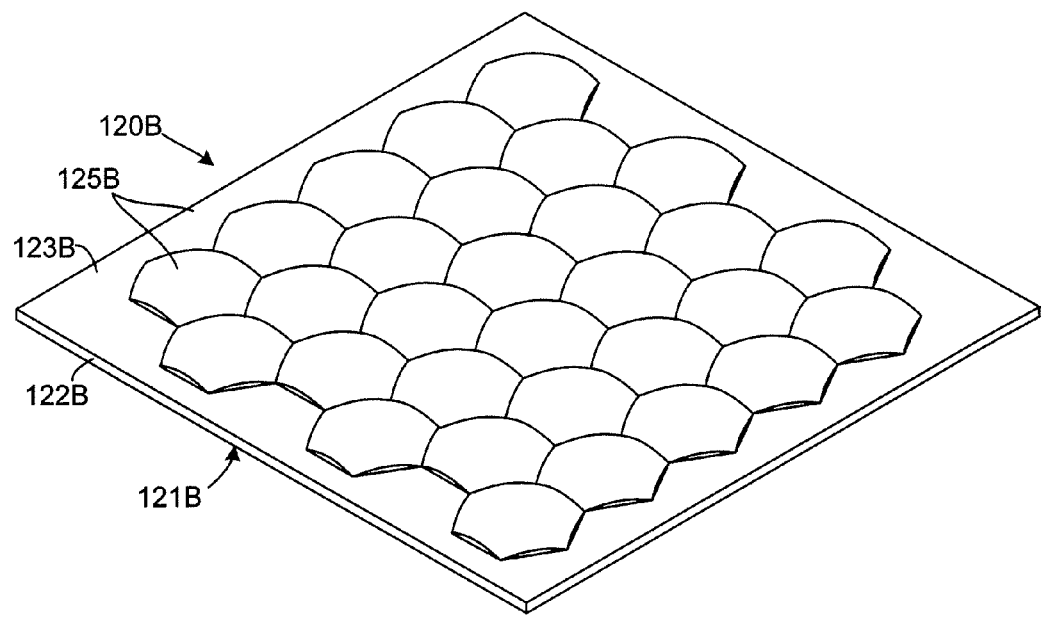
FIG. 5 is a perspective bottom view showing a lens array utilized in the solar energy harvesting device of FIG. 4.

Referring to the middle portion of FIG. 4 and to FIG. 5, lens array 120B is a molded glass or plastic structure that includes multiple lenses (focusing elements) 125B maintained in a planar array by way of a base structure 121B having a peripheral side edge 122B, a lower surface 123B and an upper surface 124B. As indicated in FIG. 5, in each lens 125B of array 120B is formed by a substantially dome-shaped portion of the optical (e.g., glass or plastic) material that protrudes from lower surface 123B.

Figure 6:
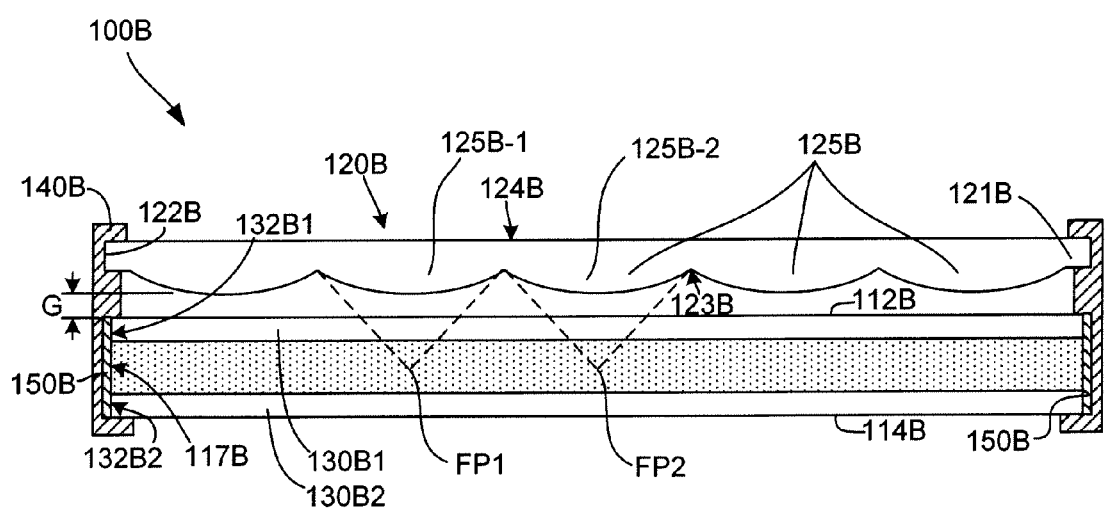
FIG. 6 is a simplified cross-sectional side view showing the solar energy harvesting device of FIG. 4 in an assembled state.

Referring to the lower portion of FIG. 4, lightguide structure 110B includes an upper (first) transparent layer 130B1 and a lower (second) transparent layer 130B2 that sandwich SRM-bearing material layer 115B therebetween. Upper transparent layer 130B1 and a lower transparent layer 130B2 comprise a solid light transparent material (e.g., glass or clear plastic), with the upward-facing surface of upper transparent layer 130B1 forming upper (first) surface 112B of the lightguide structure 110B, and the downward-facing surface of lower transparent layer 130B2 forming lower (second) surface 114B of the lightguide 110B. Upper transparent layer 130B1 includes an outer peripheral edge 132B1 and lower transparent layer 130B2 includes an outer peripheral edge 132B2 that are substantially aligned with peripheral edge 117B of material layer 115B when lightguide structure 110B is fully assembled (as indicated in FIG. 6). Disposing SRM-bearing lightguide material layer 115B between upper transparent layer 130B1 and lower transparent layer 130B2 facilitates forming lightguide material layer 115B using a liquid or gel that can be contained between the transparent layers, which minimizes manufacturing costs while maximizing the durability of device 100B.

FIG. 6 is a simplified cross-sectional side view showing solar energy harvesting device 100B in an assembled state. As indicated in FIG. 6, rigid frame 140B includes a first peripheral mounting groove disposed to receive peripheral edges 117B, 132B1, 132B2 of lightguide structure 110B and a second peripheral mounting groove disposed to receive peripheral edge 122B of lens array 120B such that lens array 120B is maintained at a predetermined gap distance G from the upper surface 112B of lightguide structure 110B. By providing frame with such mounting features, frame 140B both facilitates accurate and inexpensive assembly of device 100B, and also serves to reliably maintain the necessary gap G between lightguide structure 110B and lens array 120B that is needed to facilitate TIR in lightguide structure 110B.

According to another aspect of the present embodiment, lenses (focusing elements) 125B are formed and disposed such that each lens generates an associated focal point that is located inside SRM-bearing material layer 115B. For example, as indicated in FIG. 6, lens 125B1 generates an associated focal point FP1, and lens 12532 generates an associated focal point FP2, where focal points FP1 and FP2 are disposed in spaced-apart regions inside SRM-bearing material layer 115B. The benefit of this arrangement is that lens array 120B can be formed using low-cost molded glass or plastic sheets that also serves as a weather resistant outer layer for device 100B. In a specific embodiment, each lens 125B causes a spatial light concentration in some plane of 3× or greater, even more preferably greater than 5×, and yet even more preferably greater than 10×, or preferably beyond. In another specific embodiment, upper surface 124B of lens array 120B is formed as a flat (planar) surface to facilitate easy cleaning and other maintenance.

Referring again to FIG. 6, solar energy receiver 150 is disposed in the same mounting groove used to secure lightguide structure 110B, and disposed along a peripheral edges 117B, 132B1, 132B2 material layer 115B, upper transparent layer 130B1 and lower transparent layer 130B2, respectively, such that solar energy receiver 150 extends at least a portion of the distance between the upper boundary surface 112B and lower boundary surface 114B of lightguide structure 110B. In one embodiment solar energy receiver 150B comprises a photovoltaic converter based on any of Si, a-Si, CIGS, CIS, c-Si (presently preferred), poly-Si, microcrystalline Si, and multi-junction technologies, where c-Si is the presently preferred technology.

Figure 7:
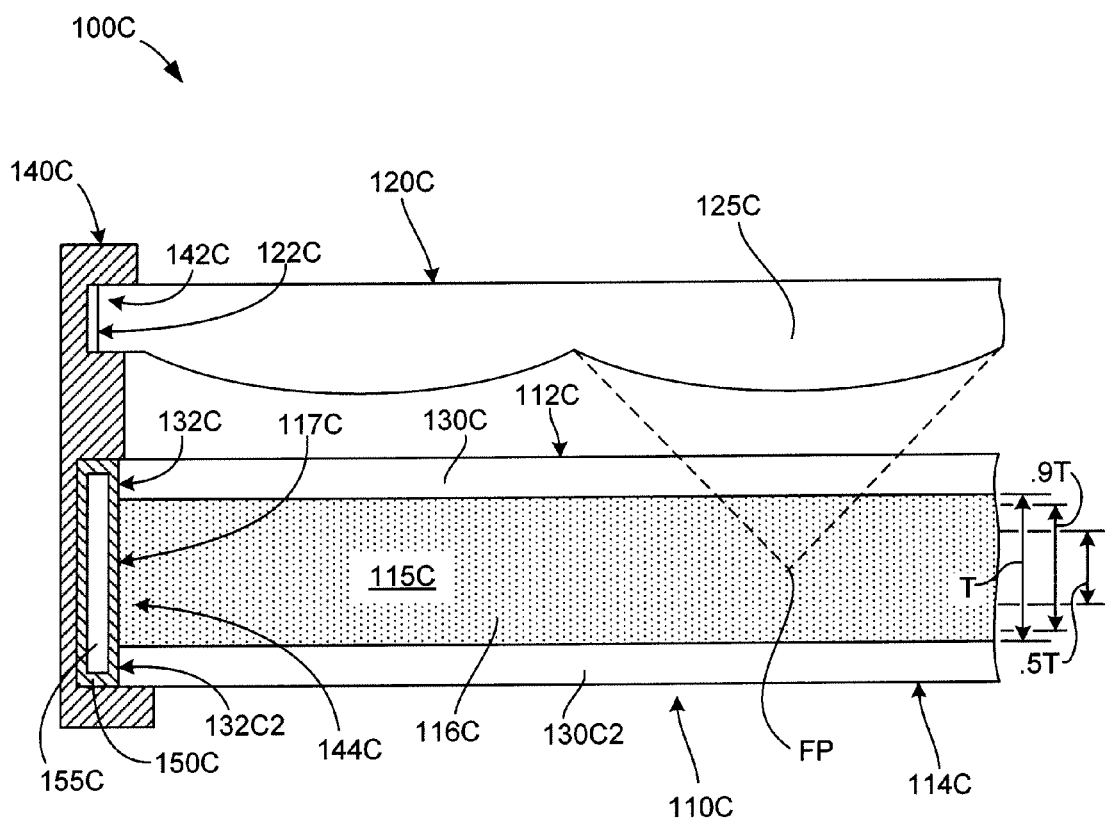
FIG. 7 is a partial cross-sectional view showing a portion of a solar energy harvesting device of the present invention according to another embodiment of the present invention.

FIG. 7 is a partial cross-sectional view showing a portion of a solar energy harvesting device 100C of the present invention according to another specific embodiment of the present invention. Device 100C is substantially identical to device 100B (described above) but includes a solar thermal device 150C having a fluid channel 155C that transfers solar radiation received from lightguide structure 110C in a manner similar to that described above.

As also illustrated in FIG. 7, according to another aspect of the present invention, focal point FP of lens 125C is positioned within a central 90% portion (0.9T) of lightguide material layer 115C, and even more preferably located within a central 50% portion (0.5T) of lightguide material layer 115C, where T represents the nominal thickness of lightguide material layer 115C.

FIG. 8 is a chemical diagram for poly(N-isopropylacrylamide) (PNIPAM) 116D, which is a phase change material (PCM) utilized as an SRM material in accordance with a presently preferred embodiment of the present invention. PNIPAM is a temperature-responsive polymer that, when heated in water above 33° C., undergoes a reversible phase transition from a swollen hydrated, substantially transparent state (e.g., depicted as SRM 116D-1 shown in FIG. 9(A)) to a shrunken dehydrated, relatively opaque state (e.g., depicted as SRM 116D-2 shown in FIG. 9(B)).

Although PNIPAM provides a transparent-to-opaque phase transformation at a nearly ideal temperature for use as the SRM in the various solar energy harvesting devices described herein, the present inventors believe other SRM materials (e.g., Methyl-Cellulose) exhibiting characteristics similar to PNIPAM could also be used to produce solar energy harvesting devices falling within the spirit and scope of the present invention.

In one embodiment the SRM-bearing material layer includes a mixture of a transparent gel/liquid carrier material and a temperature dependent SRM material that is dispersed in the carrier material. In a preferred embodiment the SRM material has a lower critical solution temperature (LCST) in the range of 30° C. and 90° C. (note that PNIPAM disposed in water has an LCST of 33° C.).

In accordance with other features, the selected SRM is selected such that the focal zone has a transparent state with a linear attenuation coefficient below 1.00 cm$^{-1}$ when the SRM is in the transparent (first) state, and such that the focal zone has a refractive index greater than 1.34 at 600 nm when the SRM is in the opaque/scattering (second) state.

In yet another specific embodiment, the SRM is a photochromic material (e.g. Spiropyrans) that is characterized by assuming a first molecular structure having a light or clear color in the transparent (first) state, and by assuming a second molecular structure having a dark color in the opaque/scattering (second) state, where the dark colored state is substantially (e.g., greater than 50%) more absorptive than the light colored state.

In yet another specific embodiment, the SRM-bearing material layer mixture further includes one or more of a radiation-absorbing dye, a defoaming agent, a thickening agent, and an anti-freeze agent. The absorbing dye (e.g., NIR980A by QCR Solutions) is preferably only absorptive at wavelengths greater than 1000 nm, and assists with light absorption to create the necessary focal heating. The optional defoaming agent (e.g., Poly-Ethylene-Glycol (PEG)) is provided to assist with filling during manufacturing. The thickening agent (binder, e.g., a commercial cellulose derivative such as HPMC) and the optional anti-freeze agent are utilized to generate the desired liquid/gel consistencies and performances.

In yet another specific embodiment, the SRM-bearing material layer mixture is in a solid form and the transparent layers are omitted (i.e., the upper and lower surfaces of the SRM-bearing material layer form the upper and lower surfaces of the lightguide structure).

Figure 10:
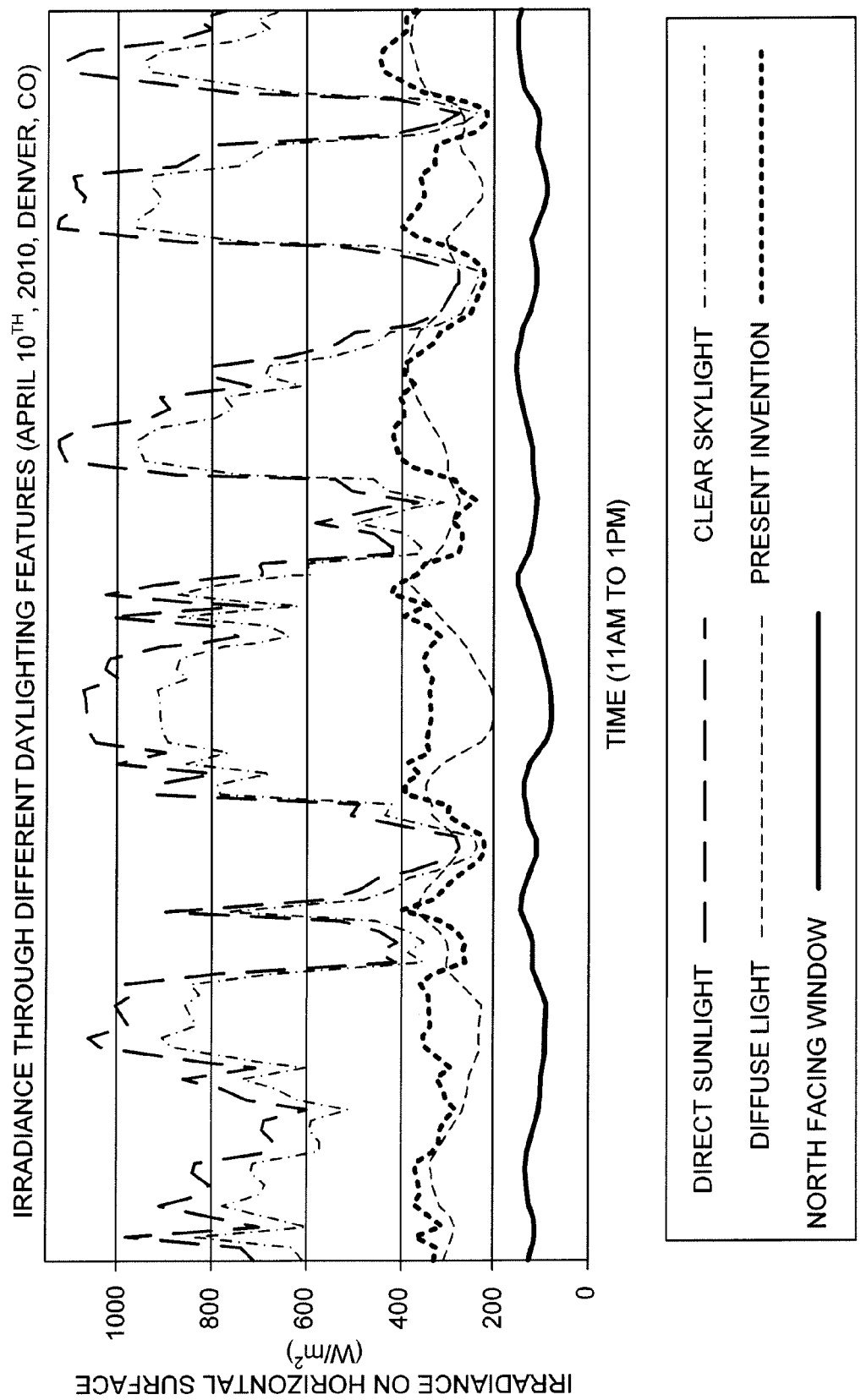
FIG. 10 is a graph illustrating light transmission properties of the solar energy harvesting device of the present invention.
Figure 11:
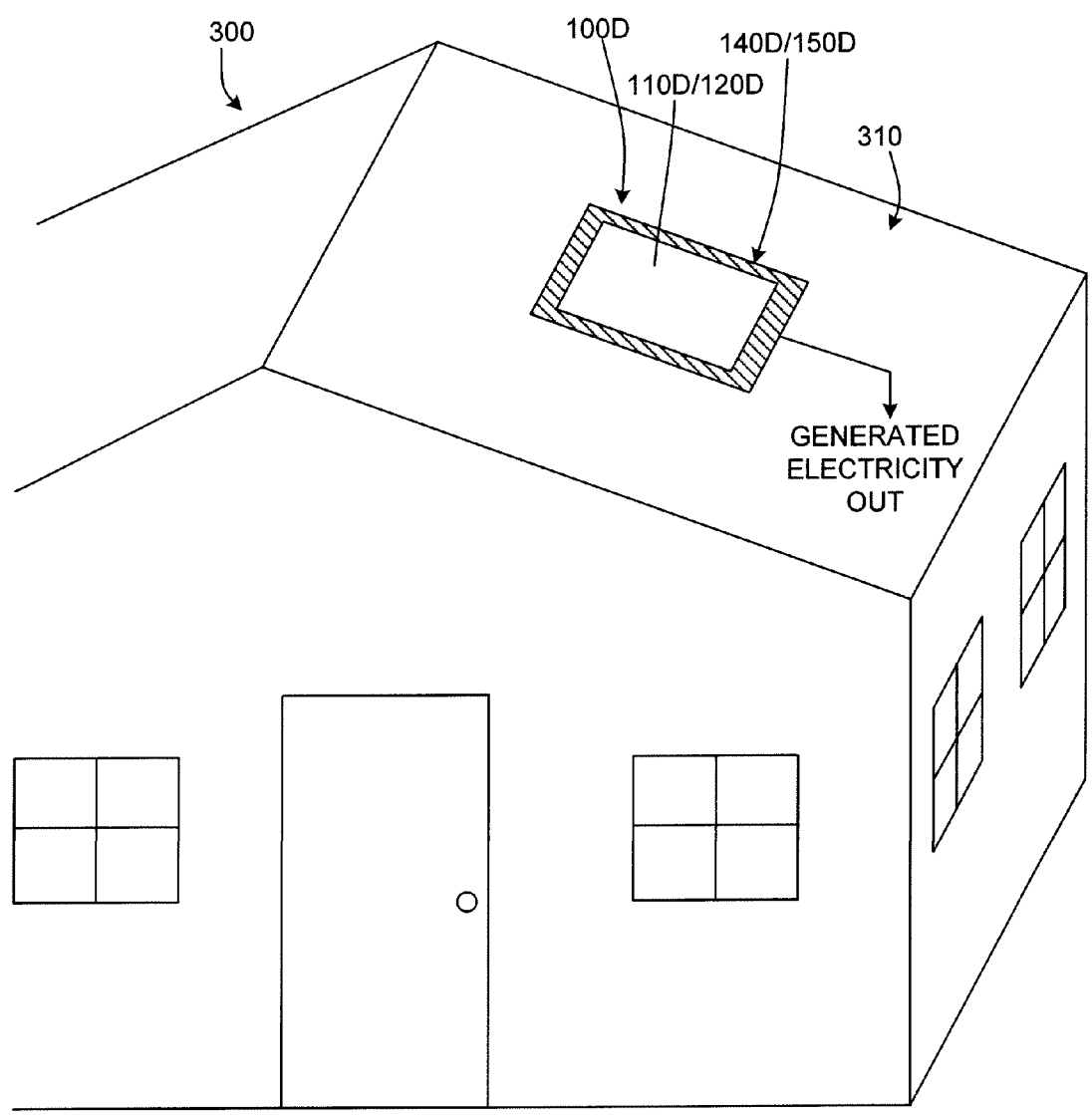
FIG. 11 is a partial perspective view showing a building structure incorporating a solar energy harvesting device of the present invention as both a power source and a skylight according to another embodiment of the present invention.
Figure 12A:
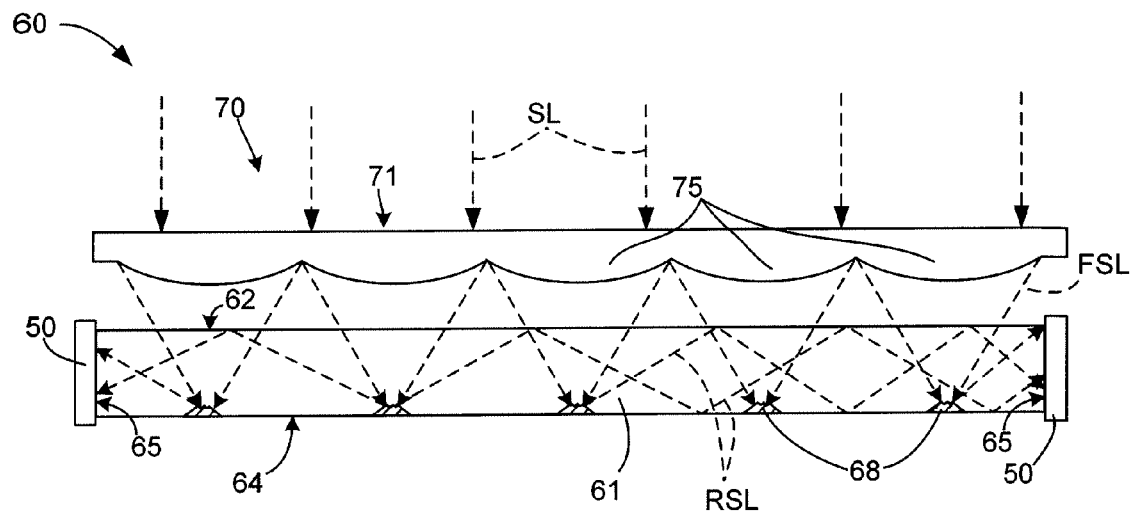
FIGS. 12(A) and 12(B) are cross-sectional side views showing a prior art lightguide-type solar concentrator.
Figure 12B:
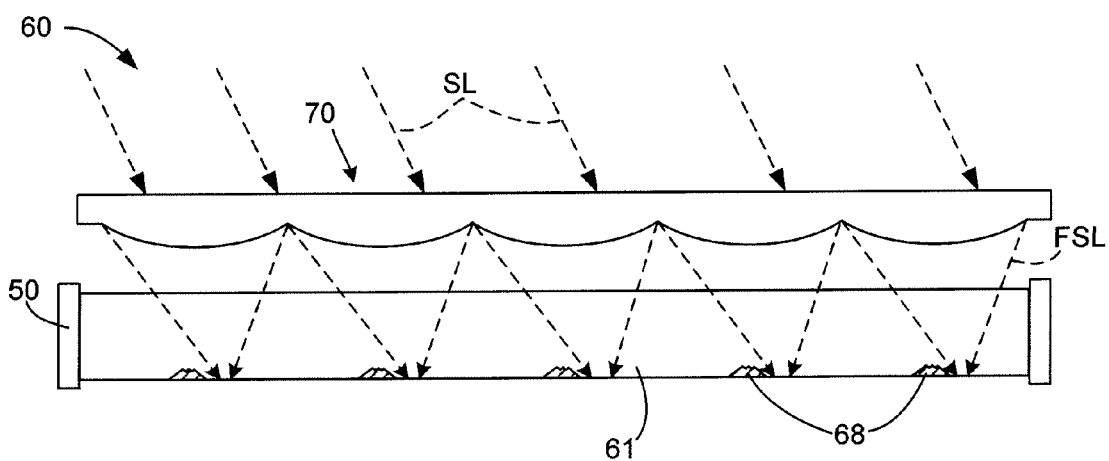

According to another aspect of the present invention, because a majority of the lightguide structure remains substantially entirely transparent to diffuse light whether, and because the SRM disposed in the focal zones changes to the opaque/scattering state such that direct sunlight is prevented from passing through the lightguide structure, the solar energy harvesting devices described herein are able to serve a secondary purpose as a self-adjusting solar transmission "skylight" apparatus on a residence or other building structure. That is, as indicated in the graph shown in FIG. 10, which shows irradiance through different daylighting features on a typical day (where sunny periods are indicated by peak irradiance values and cloudy periods are indicated by lower "trough" irradiance values), the solar energy harvesting devices of the present invention produce normalized lighting that eliminates all direct sunlight (i.e., all but about 15%) and passes nearly all diffuse light (approximately 80%). Thus, as shown in FIG. 11, when a solar energy harvesting device 100D according to the present invention is operably mounted in a daylighting arrangement (e.g., on a roof 310 of a house 300) by way of a suitable frame 140D, in addition to generating electricity or other converted solar energy by way of solar receiver 150D, the SRM material in lightguide structure 110D serves to block most of the direct sunlight focused by light concentrating member 120D from passing into the interior space disposed under skylight/device 100D, thereby preventing undesirable high radiance areas and reducing air conditioning costs, while allowing a significant amount of diffuse light to enter the interior space, thus reducing lighting costs. Additional features and benefits associated with the use of the present invention in conjunction with the secondary purpose of daylighting are described in co-owned and co-filed U.S. patent application Ser. No. 12/955,743 ("SELF-ADJUSTING SOLAR LIGHT TRANSMISSION APPARATUS"), now U.S. Pat. No. 8,040,609, which is incorporated herein by reference in its entirety.

Although the present invention has been described with reference to certain specific embodiments, it will be clear to those skilled in the art that the inventive features of the present invention are applicable to other embodiments as well, all of which are intended to fall within the scope of the present invention. For example, although the present embodiment is described herein with specific reference to lens array-type concentrating members, those skilled in the art will recognize that the purpose and function of the disclosed lens arrays may be implemented using other array structures including lenses or other light focusing elements (e.g., mirrors), where each of the focusing elements focuses a corresponding portion of incident sunlight at an associated focal point in a manner similar that described herein.

The invention claimed is:

1. A solar energy harvesting device comprising:
a lightguide structure having opposing, locally parallel first and second boundary surfaces defining a peripheral edge extending between the first and second surfaces and comprising a material layer including a stimuli-responsive material (SRM) that is evenly distributed throughout the material layer, said material layer being disposed between the first and second boundary surfaces;
means for concentrating solar radiation directed onto said device such that said solar radiation is concentrated at a focal point disposed inside the material layer; and
a solar energy receiver disposed in a fixed relationship to said lightguide structure,
wherein the SRM is characterized such that all of said SRM disposed in said material layer assumes a first state when a first amount of said concentrated solar radiation at said focal point is below a predetermined first level, and such that a portion of said SRM disposed in a focal zone adjacent to said focal point changes from the first state to a second state when said concentrated solar radiation at said focal point increases from said first amount to a predetermined second amount while a remaining portion of said SRM disposed outside of said focal zone remains in said first state, the second state being more opaque than the first state such that the concentrated solar radiation is redirected by said portion in said second state and transmitted through the remaining portion of said SRM in said first state,
wherein said solar energy receiver is positioned to receive at least a portion of said redirected concentrated solar radiation that is transmitted through the remaining portion of said SRM in said first state and exits the lightguide structure through said peripheral edge,
wherein said lightguide structure further comprises a first transparent layer including said first surface and a second transparent layer including said second surface, said first and second transparent layers consisting of a solid light transparent material,
wherein the material layer is disposed between said first transparent layer and said second transparent layer,
wherein the material layer further comprises a mixture including a transparent carrier material comprising one of a gel material and a liquid, and
wherein said SRM comprises a temperature dependent material having a lower critical solution temperature (LOST) in the range of 30° C. and 90° C.

2. The device of claim 1,
wherein said SRM is further characterized by being substantially entirely transparent to solar radiation in said first state, and
wherein said material layer comprises a sufficient quantity of said SRM and said first and second boundary surfaces are essentially entirely smooth such that, when the portion of said SRM in said focal zone is in said second state, at least 40% of said concentrated solar radiation directed into said focal zone is redirected by said portion into said remaining portion, and the redirected concentrated solar radiation is temporarily retained within said lightguide structure by total internal reflection between said first and second surfaces.

3. The device of claim 1, wherein said SRM is further characterized in that said concentrated solar radiation directed into said focal zone is at least ten times more likely to be scattered into said remaining portion as to be absorbed by said SRM portion in said focal zone.

4. The device of claim 1, wherein the SRM is further characterized such that the portion of said SRM disposed in said focal zone changes from said second state back to said first state when said concentrated solar radiation at said focal point subsequently decreases from said second amount back to said first amount.

5. The device of claim 1, wherein said concentrating means comprises an optical element that is fixedly positioned relative to the lightguide structure such that said focal point defined by said optical element is determined by an incident angle of said solar radiation directed onto said device, whereby when said device is maintained in a stationary position throughout daylight hours, said focal point moves inside said material layer in accordance with movement of the sun.

6. The device of claim 1, wherein said mixture comprises poly(N-isopropylacrylamide) (PNIPAM) and water.

7. The device of claim 1, wherein said focal zone has a transparent state with a linear attenuation coefficient below $1.00\,cm^{-1}$ when said portion of said SRM is in said first state.

8. The device of claim 1, wherein said focal zone has a refractive index greater than 1.34 at 600 nm when said portion of said SRM is in said second state.

9. The device of claim 1, wherein said material layer comprises a solid structure including said SRM.

10. The device of claim 1, wherein said concentration means comprises an array of focusing elements disposed such that each of the focusing elements generates at least one associated focal point.

11. The device of claim 10, wherein said concentration means comprises a lens array including a plurality of lens structures disposed in a planar arrangement such that each of the plurality of lens structures generates an associated focal point that is located inside of said lightguide.

12. The device of claim 11, wherein each of said plurality of lens structures comprises a spatial light concentration in some plane of 3× or greater.

13. The device of claim 11,
wherein said lightguide structure has a predetermined thickness, and
wherein said focal point of each of said plurality of lens structures is located within a central 90% portion of the thickness of said lightguide structure.

14. The device of claim 1, wherein the device further comprises a frame disposed on the peripheral edge of the lightguide structure and being connected to said concentrating means such that said concentrating means is maintained at a predetermined gap distance from the first surface of the lightguide structure.

15. The device of claim 1, wherein said a solar energy receiver is disposed along the peripheral edge of the lightguide structure and extends at least a portion of the distance between the first and second boundary surfaces.

16. The device of claim 15, wherein said solar receiver comprises one of a photovoltaic converter and a solar thermal device.

17. A solar energy harvesting device comprising:
a lightguide structure having opposing, locally parallel first and second boundary surfaces defining a peripheral edge extending between the first and second surfaces and comprising a material layer including a stimuli-responsive material (SRM) that is evenly distributed throughout the material layer, said material layer being disposed between the first and second boundary surfaces;
means for concentrating solar radiation directed onto said device such that said solar radiation is concentrated at a focal point disposed inside the material layer; and
a solar energy receiver disposed in a fixed relationship to said lightguide structure,
wherein the SRM is characterized such that all of said SRM disposed in said material layer assumes a first state when a first amount of said concentrated solar radiation at said focal point is below a predetermined first level, and such that a portion of said SRM disposed in a focal zone adjacent to said focal point changes from the first state to a second state when said concentrated solar radiation at said focal point increases from said first amount to a predetermined second amount while a remaining portion of said SRM disposed outside of said focal zone remains in said first state, the second state being more opaque than the first state such that the concentrated solar radiation is redirected by said portion in said second state and transmitted through the remaining portion of said SRM in said first state,
wherein said solar energy receiver is positioned to receive at least a portion of said redirected concentrated solar radiation that is transmitted through the remaining portion of said SRM in said first state and exits the lightguide structure through said peripheral edge,
wherein said lightguide structure further comprises a first transparent layer including said first surface and a second transparent layer including said second surface, said first and second transparent layers consisting of a solid light transparent material,
wherein the material layer is disposed between said first transparent layer and said second transparent layer,
wherein the material layer further comprises a mixture including a transparent carrier material comprising one of a gel material and a liquid,
wherein said SRM comprises a phase change material (PCM) disposed in said transparent carrier material, wherein said PCM is characterized by assuming a first molecular structure in said first state, and by assuming a second molecular structure in said second state,
wherein the PCM material is a temperature-responsive polymer characterized by assuming a hydrated first molecular structure while a temperature of said solution in said focal zone remains below a predetermined lower critical solution temperature (LCST) temperature, and by changing to a dehydrated second molecular structure when said concentrated solar radiation increases the temperature of said solution in said focal zone above said LOST temperature.

18. The device of claim 17, wherein said temperature-responsive polymer has a lower critical solution temperature (LOST) in the range of 30° C. and 90° C.

19. The device of claim 17, wherein said PCM material is further characterized by transitioning from said second molecular structure back to said first molecular structure in said focal zone when the temperature of said solution in said focal zone is reduced from above the LCST temperature to below the LOST temperature.

20. The device of claim 19, wherein said PCM material comprises one of poly(N-isopropylacrylamide) (PNIPAM) and methyl cellulose.

21. A solar energy harvesting device comprising:
a lightguide structure having opposing, locally parallel first and second boundary surfaces defining a peripheral edge extending between the first and second surfaces and comprising a material layer including a stimuli-responsive material (SRM) that is evenly distributed throughout the material layer, said material layer being disposed between the first and second boundary surfaces;
means for concentrating solar radiation directed onto said device such that said solar radiation is concentrated at a focal point disposed inside the material layer; and
a solar energy receiver disposed in a fixed relationship to said lightguide structure,
wherein the SRM is characterized such that all of said SRM disposed in said material layer assumes a first state when a first amount of said concentrated solar radiation at said focal point is below a predetermined first level, and such that a portion of said SRM disposed in a focal zone adjacent to said focal point changes from the first state to a second state when said concentrated solar radiation at said focal point increases from said first amount to a predetermined second amount while a remaining portion of said SRM disposed outside of said focal zone remains in said first state, the second state being more opaque than the first state such that the concentrated solar radiation is redirected by said portion in said second state and transmitted through the remaining portion of said SRM in said first state,
wherein said solar energy receiver is positioned to receive at least a portion of said redirected concentrated solar radiation that is transmitted through the remaining portion of said SRM in said first state and exits the lightguide structure through said peripheral edge,
wherein said lightguide structure further comprises a first transparent layer including said first surface and a second transparent layer including said second surface, said first and second transparent layers consisting of a solid light transparent material,
wherein the material layer is disposed between said first transparent layer and said second transparent layer, wherein the material layer further comprises a mixture including a transparent carrier material comprising one of a gel material and a liquid, wherein said SRM comprises a photochromic material characterized by assuming a first molecular structure in said first state, and by assuming a second molecular structure in said second state, wherein said first molecular structure has a first color that is essentially transparent to said concentrated solar radiation, a said second molecular structure has a second color that is substantially less transparent to said concentrated solar radiation than said first molecular structure, and wherein said mixture further comprises one or more of a radiation-absorbing dye, a defoaming agent, a thickening agent, and an anti-freeze agent.

22. The device of claim 21, wherein said mixture comprises a selective near infra-red (NIR) dye.

* * * * *